United States Patent [19]
Sato et al.

[11] Patent Number: 5,736,296
[45] Date of Patent: Apr. 7, 1998

[54] POSITIVE RESIST COMPOSITION COMPRISING A MIXTURE OF TWO POLYHYDROXYSTYRENES HAVING DIFFERENT ACID CLEAVABLE GROUPS AND AN ACID GENERATING COMPOUND

[75] Inventors: Mitsuru Sato, Yokohama; Kazuyuki Nitta, Kanagawa; Akiyoshi Yamazaki, Yokohama; Etsuko Iguchi, Machida; Yoshika Sakai, Atsugi; Kazufumi Sato, Sagamihara; Toshimasa Nakayama, Chigasaki, all of Japan

[73] Assignee: Tokyo Ohka Kogyo Co., Ltd., Kawasaki, Japan

[21] Appl. No.: 625,931

[22] Filed: Apr. 1, 1996

Related U.S. Application Data

[63] Continuation-in-part of Ser. No. 422,950, Apr. 17, 1995, abandoned, and a continuation-in-part of Ser. No. 498,185, Jul. 5, 1995, abandoned, which is a continuation-in-part of Ser. No. 422,950.

[30] Foreign Application Priority Data

| Apr. 25, 1994 | [JP] | Japan | 6-107492 |
| May 24, 1994 | [JP] | Japan | 6-132449 |
| Oct. 27, 1994 | [JP] | Japan | 6-286168 |
| Oct. 27, 1994 | [JP] | Japan | 6-286169 |
| Jan. 26, 1995 | [JP] | Japan | 7-28925 |

[51] Int. Cl.$^6$ .............................. G03F 7/039; G03F 7/004
[52] U.S. Cl. .................... 430/270.1; 430/170; 430/176; 430/905
[58] Field of Search ............................ 430/170, 270.1, 430/909, 905

[56] References Cited

U.S. PATENT DOCUMENTS

| 5,314,786 | 5/1994 | Roeschert et al. | 430/270.1 |
| 5,403,695 | 4/1995 | Hayase et al. | 430/270.1 |

FOREIGN PATENT DOCUMENTS 2-161-436  6/1990  Japan .................................. 430/909

*Primary Examiner*—John S. Chu
*Attorney, Agent, or Firm*—Finnegan, Henderson, Farabow, Garrett & Dunner

[57] ABSTRACT

Disclosed is an improved, chemically-amplifying positive resist composition for radiations, especially UV rays, deep-UV rays, excimer laser beams, X-rays, electron beams. The composition comprises (A) a resin component whose solubility in an alkaline aqueous solution is increased by the action of acids, (B) a compound which generates an acid when exposed to radiations, and (A) a resin component, (B) an acid-generating agent and (C) an organic carboxylic acid compound, in which said resin component (A) is a mixture comprising (a) a polyhydroxystyrene where from 10 to 60 mol % of the hydroxyl groups have been substituted by residues of a general formula (I):

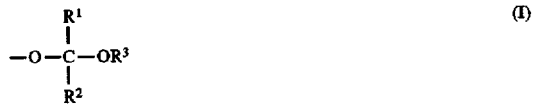

wherein $R^1$ represents a hydrogen atom or a methyl group, $R^2$ represents a methyl group or an ethyl group, and $R^3$ represents a lower alkyl group having 1 to 4 carbon atoms;

and (b) a polyhydroxystyrene where from 10 to 60 mol % of the hydroxyl groups have been substituted by tert-butoxycarbonyloxy groups. The composition has a high sensitivity, a high resolution, high heat resistance, good width characteristic in focus depth and good post-exposure storage stability, has good storage stability as a resist solution, and gives resist patterns with good profiles, without depending on the substrate to which it is applied. The composition is useful for forming fine patterns in producing ultra-LSIs.

24 Claims, No Drawings

POSITIVE RESIST COMPOSITION COMPRISING A MIXTURE OF TWO POLYHYDROXYSTYRENES HAVING DIFFERENT ACID CLEAVABLE GROUPS AND AN ACID GENERATING COMPOUND

CROSS-REFERENCE TO RELATED APPLICATION

This application is a merger of and is a continuation-in-part of U.S. application Ser. No. 08/422,950, filed Apr. 17, 1995, now abandoned, and a continuation-in-part of U.S. application Ser. No. 08/498,185, now abandoned, filed Jul. 5, 1995, which is a continuation-in-part of U.S. application Ser. No. 08/422,950, now abandoned, filed Apr. 17, 1995.

FIELD OF THE INVENTION

The present invention relates to a positive resist composition and, more precisely, to a chemically-amplifying positive resist composition sensitive to UV rays, deep-UV rays, excimer laser beams(such as KrF laser, ArF laser, etc.), X-rays, electron beams, etc., which has a high sensitivity, a high resolution, high heat resistance, good width characteristic in focus depth and good post-exposure storage stability, has good storage stability as a resist solution, and gives resist patterns with good profiles on substrates without depending on substrates to which it is applied.

BACKGROUND OF THE INVENTION

Semiconductor devices such as ICs, LSIs, etc, have heretofore been produced by repeating several times a series of processes comprising photolithography using photoresist compositions, etching, diffusion of impurities and wiring. Concretely, in the photolithographic process, a thin film of a photoresist composition is formed on a silicon wafer by means of, for example, spin coating, the resultant is exposed to active rays such as UV rays, etc., via a mask pattern for a semiconductor device, and then developed to give a resist pattern, and thereafter the silicon wafer thus having thereon the resist pattern acting as a protective film is etched. As the photoresist composition preferably used in the photolithography, there has been known a positive photoresist composition comprising, as basic components, an alkali-soluble novolak resin and a quinonediazido group-containing compound for which a resolution on the order of sub-microns (1 µm or less) or still half-microns (0.5 µm or less) is required and which uses UV rays such as g-line (436 nm) and i-line (365 nm) for exposure.

Recently, larger scale integrations in semiconductor devices are desired increasingly, requiring ultra-fine patterning on the order of quarter microns (0.25 µm or less) in the mass production of ultra-LSIs, etc. However, the conventional positive photoresist composition comprising, as basic components, an alkali-soluble novolak resin and a quinonediazido group-containing compound hardly gives such an ultra-fine patterning as mentioned above. Therefore, it has been demanded to develop a resist using deep-UV rays of shorter wavelength (200~300 nm), excimer laser beams such as KrF laser and ArF laser, electron beams and X-ray. At present, a chemically-amplifying resists which can achieve a high resolution, use the catalytic and chain reactions of the acid to be generated by exposure to radiations, have a quantum yield of 1 or more, and can achieve a high sensitivity, have been of interest and developed intensively.

As one example of such chemically-amplifying positive resists, there is known a resist comprising a resin component derived from polyhydroxystyrene by substituting its hydroxyl groups by tert-butoxycarbonyloxy groups or the like and an acid-generating agent of an onium salt or the like (U.S. Pat. No. 4,491,628).

However, the above-mentioned, known chemically-amplifying positive resist was not satisfactory in practical use, since the resolution and the width characteristic in focus depth are not satisfactory, and since it may cause a problem so-called bridging that the crosssectional profile of the patterns to be made of the resist is often broadened upward like eaves. Concretely, when the chemically-amplifying positive resist coated on a substrate are exposed, stored for a while and then developed to give patterns, the patterns cannot have good profiles since the acids generated by the exposure are inactivated while the exposed resist films are stored. (which phenomenon is referred to as decrease in "post-exposure storage stability" of the positive resist, hereinafter)

The problem of post-exposure storage stability is peculiar to chemically-amplifying positive resists. When the bridging occurs, a desired wiring pattern cannot be given, which is a serious problem for the production of semiconductor devices. For the purpose of improving the post-exposure storage stability, there has been proposed a method in which a top coating layer is provided on a resist layer, whereby the inactivation of the acids generated by the exposure is prevented. In this method, however, the production steps are increased, which leads the decrease in throughput and high production cost as well. From these reasons, this method is unfavorable. Accordingly, there has been strongly demanded to develop a resist having good post-exposure storage stability without providing a top coating layer.

The above-mentioned chemically-amplifying positive resist has another problem that it characteristically depended on substrates to which they are applied, and some of them, when applied on an unsuitable substrate such as a substrate coated with an insulating film such as silicon nitride (SIN), boron-phosphorus-silicate glass (BPSG) or the like film or on a substrate coated with titanium nitride (TIN), often formed resist patterns with poor profiles expanding downward to the substrates (which is referred to as "substrate dependency", hereinafter). It has been assumed that the acids generated by the exposure are inactivated by the action of amines remaining around the substrate in the film formation step, which causes the formation of resist patterns with poor profiles expanding downward to the substrates.

Moreover, when such resist is coated on a substrate coated with a metallic film such as an aluminum-silicon-copper (Al-Si-Cu) alloy film and a tungsten (W) film, the resist pattern formed is influenced by standing waves and the crosssectional profile of the resist pattern is waved. For the purpose of solving the problems of such substrate dependency and influence by standing waves, there has been proposed a method in which an anti-reflection coating layer is provided between the substrate and the resist layer. In this method, however, the production steps are increased, which leads the decrease in throughput and high production cost as well. From these reasons, this method is also unfavorable. Accordingly, there has been strongly demanded to develop a resist without an anti-reflection coating layer which can give resist patterns with good profile not depending on substrates to which it is applied and hardly influenced by standing waves.

In addition to the above-mentioned problems, the conventional resist compositions have still another problem. That is, when the resist compositions are prepared in solutions, they have such a poor storage stability that the solutions often generate solid substances while the solutions are stored. Accordingly, there has also been demanded to develop a resist composition capable of giving a resist solution which has a good storage stability and does not generate any solid substances during it is stored.

In these situations, we, the present inventors have assiduously studied so as to develop chemically-amplifying positive resist compositions free from the above-mentioned problems and, as a result, have found that by using, as a resin component whose solubility in an alkaline aqueous solution is increased by the action of acids, a mixture of two different polyhydroxystyrenes where the hydroxyl groups have been substituted by two different kinds of substituents in certain degrees, respectively, and also a mixture of the preceeding two different polyhydroxystyrenes and an organic carboxylic acid, it becomes possible to provide a chemically-amplifying positive resist composition sensitive to radiations such as UV rays, deep-UV rays, excimer laser beams (such as KrF laser, ArF laser, etc.), X-rays, electron beams, etc., which has a high sensitivity, a high resolution, high heat resistance, good width characteristic in focus depth and good post-exposure storage stability, has good storage stability when it is prepared in a resist solution, and gives resist patterns with good profiles on substrates without depending on substrates to which it is applied. On the basis of these findings, we have completed the present invention.

SUMMARY OF THE INVENTION

One object of the present invention is to provide a positive resist composition which is sensitive to radiations, especially deep-UV rays and excimer laser beams (such as KrF laser, ArF laser, etc.) and which has a high sensitivity, a high resolution, high heat resistance, good width characteristic in focus depth and good post-exposure storage stability and, furthermore, which has good storage stability when it is prepared in a resist solution.

Another object of the present invention is to provide a positive resist composition capable of forming resist patterns with good profiles, without depending on substrates to which it is applied.

The above-mentioned positive resist composition according to the present invention has a high sensitivity, a high resolution on the order of quarter microns or less, high heat resistance, good width characteristic in focus depth and good post-exposure storage stability. Furthermore, the composition is capable of forming resist patterns with good profiles, without depending on substrates to which it is applied. Therefore, the composition of the present invention is satisfactorily applicable to the process for producing semiconductor devices for which a resolution on the order of quarter microns is required. Moreover, the composition of the present invention has superior resist characteristics, compared to the resist composition mentioned above as a conventional one which comprising a resin component where the hydroxyl groups have been substituted by tert-butoxycarbonyloxy groups and an acid-generating agent. Therefore, the composition of the present invention is applicable to production of a semiconductor device in which the composition is coated on a substrate in a single layer without providing a top coat layer or an anti-reflecting coat layer which increase the steps for producing the device, by which the device can be produced at low cost and quite effectively. From these reasons, the composition of the present invention is satisfactory in practical use.

DETAILED DESCRIPTION OF THE INVENTION

The present invention attains the above-mentioned objects, providing a positive resist composition comprising (A) a resin component whose solubility in an alkaline aqueous solution is increased by the action of acids (Such a resin component is hereinafter simply referred to as "a resin component"), and (B) a compound which generates an acid when exposed to radiations (Such a compound is hereinafter referred to as "an acid-generating agent"), in which the resin component (A) is a mixture comprising from 30 to 90% by weight of (a) a polyhydroxystyrene where from 10 to 60 mol % of the hydroxyl groups have been substituted by residues of a general formula (I):

wherein $R^1$ represents a hydrogen atom or a methyl group, $R^2$ represents a methyl group or an ethyl group, and $R^3$ represents a lower alkyl group having 1 to 4 carbon atoms;

and from 10 to 70% by weight of (b) a polyhydroxystyrene where from 10 to 60 mol % of the hydroxyl groups have been substituted by tert-butoxycarbonyloxy groups, and also a positive resist composition comprising (A) a resin component, (B) an acid-generating agent and (C) an organic carboxylic acid compound.

As mentioned above, the positive resist composition of the present invention contains the component (A) of a mixture of the components (a) and (b). Therefore, the composition never cause such a decrease in either heat resistance or resolution of the resist patterns to be formed that a resist composition containing, as the component (A), a polyhydroxystyrene where the hydroxyl groups have partly been substituted by alkoxyalkoxy groups of a general formula (I) or a polyhydroxystyrene where the hydroxyl groups have partly been substituted by tert-butoxycarbonyloxy groups as a single component may occur. Furthermore, the composition of the present invention has a high sensitivity, a high resolution, high heat resistance, good width characteristic in focus depth and good post-exposure storage stability, has good storage stability when it is prepared in a resist solution, and gives resist patterns with good profiles on substrates without depending on substrates to which it is applied.

In the mixture as the resin component (A), component (a) is from 30 to 90% by weight and component (b) is from 10 to 70% by weight. In this, preferably, component (a) is from 50 to 80% by weight and component (b) is from 20 to 50% by weight. Concretely mentioned, as specific examples of the residues of the general formula (I) in the component (a), are 1-methoxyethoxy group, 1-ethoxyethoxy group, 1-n-propoxyethoxy group, 1-iso-propoxyethoxy group, 1-n-butoxyethoxy group, 1-iso-butoxyethoxy group, 1-(1,1-dimethylethoxy)-1-methylethoxy group, 1-methoxy-1-methyl-ethoxy group, 1-ethoxy-1-methyl-ethoxy group, 1-n-propoxy-1-methylethoxy group, 1-isobutoxy-1-methylethoxy group, 1-methoxy-n-propoxy group, and 1-ethoxy-n-propoxy group. Among these, especially preferred are 1-ethoxy-ethoxy group and 1-methoxy-n-propoxy group, since the sensitivity and the resolution of the positive resist composition containing the resin component are well balanced and improved.

In the positive resist composition of the present invention, the acid to be generated by the acid-generating agent partly decomposes the tert-butoxycarbonyloxy groups and the residues of formula (I), by which the solubility of the resin component (A) in an alkali aqueous solution on the exposed regions of the film and the dissolution-inhibiting ability thereof on the unexposed regions of the film are well balanced, resulting in that the positive resist composition has a high sensitivity, a high resolution and high heat resistance, as well as improved width characteristic in focus depth.

The above-mentioned component (a) is a polyhydroxystyrene in which the hydroxyl groups have been partly substituted by the residues of formula (I) above, for example, by a known substitution reaction between an unsubstituted polyhydroxystyrene and 1-chloro-1-ethoxyethane, 1-chloro-1-methoxypropane or the like. In this, the degree of substitution of the hydroxyl groups with such residues is from 10 to 60 mol %, preferably from 20 to 50 mol %. If the degree of substitution is less than 10 mol %, the positive resist composition containing the resin component cannot give resist patterns with good profiles. If, however, it is more than 60 mol %, the sensitivity of the composition is lowered. Therefore, the degree of substitution not falling within the defined range is unfavorable. In practical use of the composition, the degree of substitution is preferably from 20 to 50 mol %.

The above-mentioned component (b) is a polyhydroxystyrene in which the hydroxyl groups have been partly substituted by tert-butoxycarbonyloxy groups, for example, by a known substitution reaction between an unsubstituted polyhydroxystyrene and di-tert-butyl-di-carbonate or the like. In this, the degree of substitution of the hydroxyl groups with tert-butoxycarbonyloxy groups is from 10 to 60 mol %, preferably from 20 to 50 mol %. If the degree of substitution is less than 10 mol %, the positive resist composition containing the resin component cannot give resist patterns with good profiles. If, however, it is more than 60 mol %, the sensitivity of the composition is lowered. Therefore, the degree of substitution not falling within the defined range is unfavorable. In practical use of the composition, the degree of substitution is preferably from 20 to 50 mol %.

Each of the above-mentioned resin component shall have a weight-average molecular weight falling within the range between 3,000 and 30,000, preferably form 8,000 to 22,000, measured by gel permeation chromatography (GPC) based on polystyrene. If the weight-average molecular weight is less than the defined range, the coatability of the composition containing the resin is poor. If, however, it is more than the same, the solubility of the resin in an aqueous alkaline solution is lowered. And the resin components of the present invention shall have a molecular weight distribution ($M_w / M_n$), which is defined as a ratio between a weight-average molecular weight and a number-average molecular weight, falling within the range between 3 to 5.

As the above-mentioned resin component (A), is mentioned only a mixture comprising two kinds of polyhydroxystyrenes where the hydroxyl groups have been substituted by the alkoxyalkoxy groups of formula (I) and tert-butoxycarbonyloxy groups respectively. However, the resin component (A) to be in the composition of the present invention is not specifically limited to the above-mentioned resin component, and may be a mixture comprising two or more kinds of polyhydroxystyrenes where the hydroxyl groups have been substituted by any known acid-releasable substituents such as tetrahydropyranyloxy groups, tetrahydrofuranyloxy groups, trimethylsilyloxy groups and the like, respectively.

The acid-generating agent to be in the composition of the present invention is not specifically defined but may be any known acid-generating agent. Concretely mentioned, as the agent, are (i) bissulfonyldiazomethanes such as bis(p-toluenesulfonyl)diazomethane, methylsulfonyl-p-toluenesulfonyldiazomethane, 1-cyclohexylsulfonyl-1-(1,1-dimethyl-ethylsulfonyl)diazomethane, bis(1,1-dimethyl-ethylsulfonyl) diazomethane, bis(1-methylethylsulfonyl) diazomethane, bis(cyclohexylsulfonyl)diazomethane, bis(2, 4-dimethylphenylsulfonyl)diazomethane, bis-(4-ethylphenylsulfonyl)diazomethane, bis(3-methylphenylsulfonyl)diazomethane, bis(4-methoxyphenylsufonyl)diazomethane, bis(4-fluorophenylsulfonyl)diazomethane, bis(4-chlorophenylsulfonyl)diazomethane, and bis(4-tert-butylphenylsulfonyl)diazomethane; (ii) sulfonylcarbonyl alkanes such as 2-methyl-2-(p-toluenesulfonyl) propiophenone, 2-(cyclo-hexyl-carbonyl)-2-(p-toluene sulfonyl)propane, 2-methanesulfonyl-2-methyl-(4-methylthio) propiophenone, and 2,4-dimethyl-2-(p-toluenesulfonyl)pentane -3-one; (iii) sulfonyl carbonyldiazomethanes such as 1-p-toluenesulfonyl-1-cyclohexylcarbonyldiazomethane, 1-diazo-1-methylsulfonyl-4-phenyl-2-butanone, 1-cyclohexyl-sulfonyl-1-cyclohexylcarbonyldiazomethane, 1-diazo-1-cyclohexylsulfonyl -3,3-di-methyl-2-butanone, 1-diazo-1-(1,1-di-methylethyl sulfonyl)-3,3-di-methyl-2-butanone, 1-acetyl-1-(1-methylethyl sulfonyl)diazomethane, 1-diazo-1-(p-toluenesulfonyl)-3,3-dimethyl-2-butanone, 1-diazo-1-benzenesulfonyl-3,3-di-methyl-2-butanone, 1-diazo-1-(p-toluene sulfonyl)-3-methyl-2-butanone, 2-diazo-2-(p-toluenesulfonyl)cyclohexylacetate, 2-diazo-2-benzene sulfonyl tert-butyl acetate, 2-diazo-2-methanesulfonyl isopropyl acetate, 2-diazo-2-benzenesulfonyl cyclohexyl acetate, and 2-diazo-2-(p-toluenesulfonyl)tert-butyl acetate; (iv) nitrobenzyl derivatives such as 2-nitrobenzyl-p-toluenesulfonate, 2,6-dinitrobenzyl-p-toluenesulfonate, and 2,4-dinitrobenzyl-p-trifluoro-methylbenzenesulfonate; and (v) esters of polyhydroxy compounds and aliphatic or aromatic sulfonic acids such as pyrogallic methane sulfonate ester (pyrogallol trimesylate), pyrogallic benzene sulfonate ester, pyrogallic p-toluene sulfonate ester, pyrogallic p-methoxy benzene sulfonate ester, pyrogallic mesitylene sulfonate ester, pyrogallic benzylsulfonate ester, alkyl gallic acid methane sulfonate ester, alkyl gallic acid benzene sulfonate ester, alkyl gallic acid p-toluene sulfonate ester, alkyl gallic acid p-methoxy benzene sulfonate ester, alkyl gallic acid mesitylene sulfonate ester, and alkyl gallic acid benzylsulfonate ester. Preferred are the alkyl group in the afore-mentioned alkyl gallic acid where the alkyl group has from 1 to 15 carbon atoms, and especially octyl group or lauryl group. (vi) onium salt-based acid-generating agents to be in a general formula (II) and (III), and (vii) benzoin tosylate-based acid-generating agents to be in a general formula (IV) may be used. A general formula (II);

where $R^4$ and $R^5$ are aryl groups or aryl groups having a substituent and may be respectively identical or different; $X^-$ is any of $AsF_6^-$, $SbF_6^-$, $PF_6^-$, $BF_4^-$, or $CF_3SO_3^-$;

and a general formula (III);

where $R^6$, $R^7$, and $R^8$ are aryl groups or aryl groups having a substituent and may be respectively identical or different; $X^-$ is any of $AsF_6^-$, $SbF_6^-$, $PF_6^-BF_4^-$, or $CF_3SO_3^-$.

A general formula (IV);

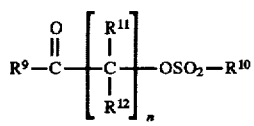

where $R^9$ and $R^{10}$ are aryl groups or aryl groups having a substituent and may be identical or different; $R^{11}$ and $R^{12}$ are hydrogen atoms, lower alkyl groups, hydroxyl groups, or aryl groups and may be identical or different. n is 0 or 1.

The following are offered as specific onium salts presented by general formulas (II) and (III).

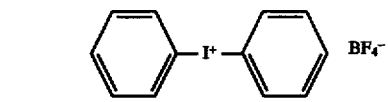

diphenyliodonium tetrafluoroborate

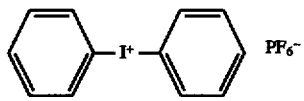

diphenyliodonium hexafluorophosphate

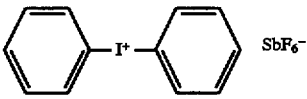

diphenyliodonium hexafluoroantimonate

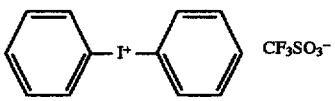

diphenyliodonium trifluoromethane sulfonate

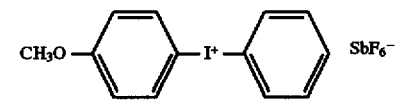

(4-methoxyphenyl)phenyliodonium hexafluoroantimonate

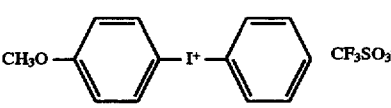

(4-methoxyphenyl)phenyliodonium trifluoromethane sulfonate

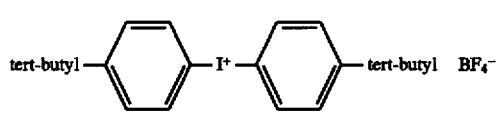

bis(p-tert-butylphenyl)iodonium tetrafluoroborate

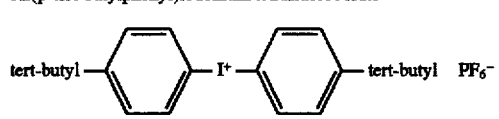

bis(p-tert-butylphenyl)iodonium hexafluorophosphate

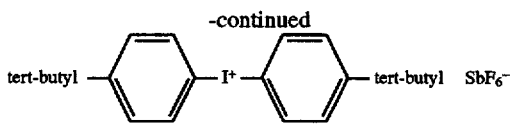

bis(p-tert-butylphenyl)iodonium hexafluoroantimonate

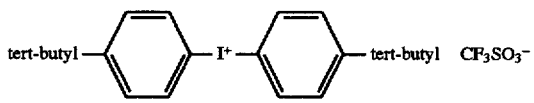

bis(p-tert-butylphenyl)iodonium trifluoromethane sulfonate

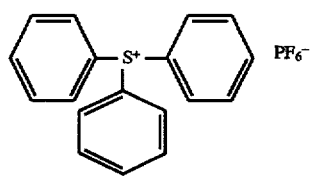

triphenylsulfonium hexafluorophosphate

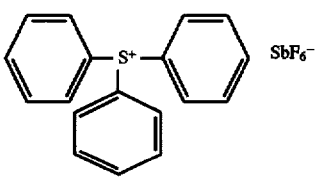

triphenylsulfonium hexafluoroantimonate

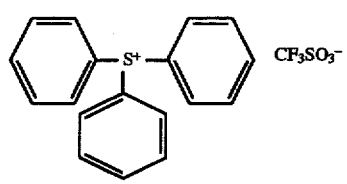

triphenylsulfonium trifluoromethane sulfonate

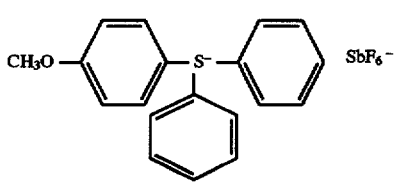

(4-methoxyphenyl)diphenylsulfonium hexafluoroantimonate

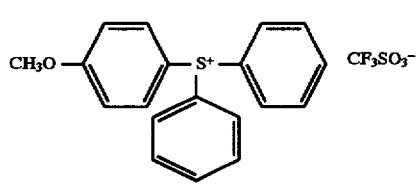

(4-methoxyphenyl)diphenylsulfonium trifluoromethane sulfonate

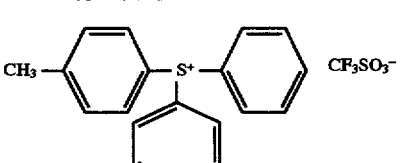

(4-methylphenyl)diphenylsulfonium trifluoromethane sulfonate

-continued

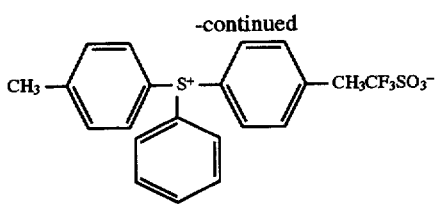

bis(4-methylphenyl)phenylsulfonium trifluoromethane sulfonate

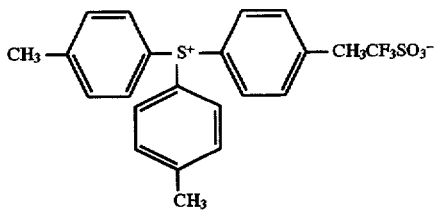

tris(4-methylphenyl)sulfonium trifluoromethane sulfonate

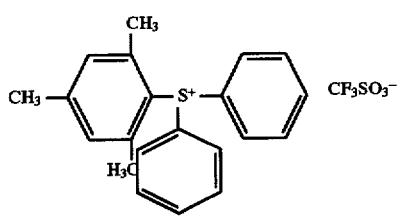

(2,4,6-trimethylphenyl)diphenylsulfonium trifluoromethane sulfonate

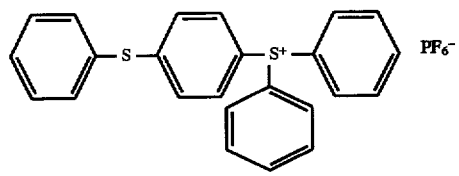

diphenyl[4-(phenylthio)phenyl]sulfonium hexafluorophosphate

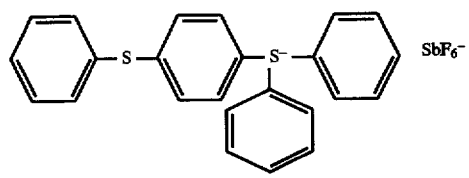

diphenyl[4-(phenylthio)phenyl]sulfonium hexafluoroantimonate

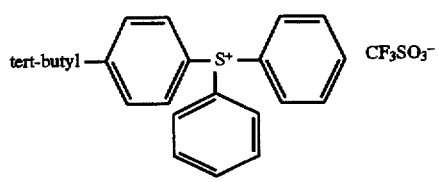

(4-tert-butyl-phenyl)diphenylsulfonium trifluoromethane sulfonate

Among these onium salts, onium salts where trifluoromethanesulfonate forms a negative ion are favorable in that they do not contain phosphorous, boron, antimony, or other atoms used as dispersing agents during semiconductor element manufacturing.

(vii) The following compounds are offered as specific benzoin tosylate-based acid-forming agents.

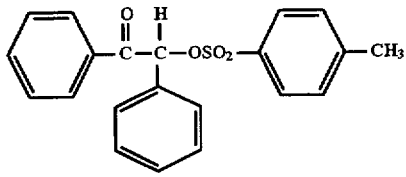

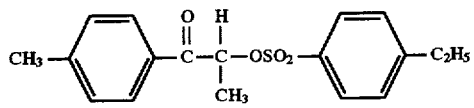

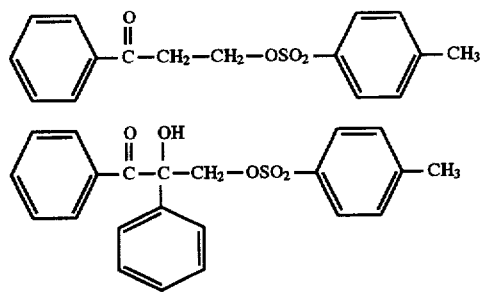

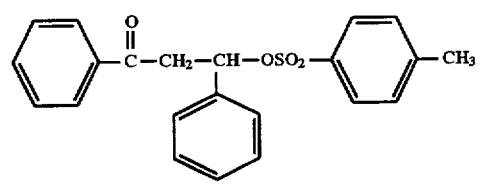

One of these acid-forming agents may be used, or two or more may be used in combination. Among these, as the acid-generating agents to be in the resists for excimer laser beams, preferred are bissulfonyl diazomethanes, especially bis(cyclohexylsulfonyl)diazomethane, bis(2,4-dimethylphenylsulfonyl)diazomethane and their mixture. Particularly, the mixture is preferred since the composition containing the mixture has high sensitivity.

As the acid-generating agents to be in the resists for electron beams, other acid-generating agents than the above-mentioned (i) and (iii) can be employed. Especially preferred are nitrobenzyl derivatives of (iv), particularly 2,6-dinitrobenzyl-p-toluenesulfonate; esters of polyhydroxy compounds and aliphatic or aromatic sulfonic acids of (V), particularly pyrogallol trimesylate; onium salts of (vi), particularly bis(p-tert-butylphenyl)iodonium trifluoromethanesulfonate, triphenyl-sulfonium trifluoromethanesulfonate; and (vii) benzoin tosylate type acid-generating agents.

The proportion of the above-mentioned acid-generating agent to be in the composition of the present invention may be from 1 to 20 parts by weight, preferably from 2 to 10 parts by weight, relative to 100 parts by weight of the resin component in the composition. If the proportion of the acid-generating agent is less than 1 part by weight, the agent insufficiently exhibits its effect. If, however, it is more than 20 parts by weight, such too much amount of the agent cannot be completely dissolved in a solvent and, in addition, the miscibility of the agent with the resin component is lowered.

An organic carboxylic acid compound may be added to the resist composition of the present invention, and the composition containing it has a high sensitivity, a high resolution, good width characteristic in focus depth, and gives resist patterns with good profiles. In particular, the composition containing an organic carboxylic acid compound has good post-exposure storage stability, while giving resist patterns with good profiles on various substrates.

The organic carboxylic acid compound to be in the composition of the present invention is not specifically defined but may be any of saturated or unsaturated aliphatic carboxylic acids, alicyclic carboxylic acids, hydroxycarboxylic acids, alkoxy-carboxylic acids, keto-carboxylic acids, aromatic carboxylic acids, etc. For example, the acid compound includes aliphatic mono- or polycarboxylic acids such as formic acid, acetic acid, propionic acid, butyric acid, isobutyric acid, oxalic acid, malonic acid, succinic acid, glutaric acid, and adipic acid; alicyclic carboxylic acids such as 1,1-cyclo-hexanedicarboxylic acid, 1,2-cyclohexanedicarboxylic acid, 1,3-cyclohexanedicarboxylic acid, 1-4-cyclohexanedicarboxylic acid, and 1,1-cyclohexyldiacetic acid; unsaturated aliphatic carboxylic acids such as acrylic acid, crotonic acid, isocrotonic acid, 3-butenoic acid, methacrylic acid, 4-pentenoic acid, propiolic acid, 2-butynoic acid, maleic acid, fumaric acid, and acetylenecarboxylic acid; hydroxycarboxylic acids such as hydroxyacetic acid; alkoxycarboxylic acids such as methoxyacetic acid and ethoxyacetic acid; keto-carboxylic acids such as pyruvic acid; and aromatic carboxylic acid compounds described by a general formula (V)

(V)

wherein $R^{13}$ and $R^{14}$ each independently represent a hydrogen atom, a hydroxyl group, a nitro group, a carboxyl group or a vinyl group, provided that both $R^{13}$ and $R^{14}$ should not be hydrogen atoms.

or those of a general formula (VI):

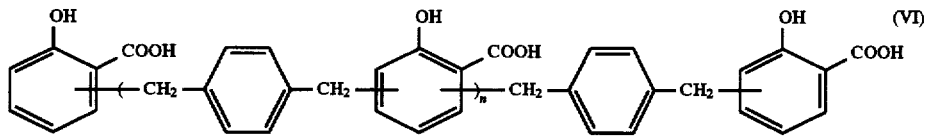

(VI)

wherein n represents 0 or an integer of from 1 to 10. etc.

Of these, especially preferred are alicyclic-carboxylic acid compounds, unsaturated aliphatic carboxylic acid compounds and aromatic carboxylic acid compounds.

As examples of the aromatic carboxylic acid compounds of formula (V), mentioned are p-hydroxybenzoic acid, o-hydroxybenzoic acid, 2-hydroxy-3-nitrobenzoic acid, 3,5-dinitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-vinylbenzoic acid, 4-vinylbenzoic acid, phthalic acid, terephthalic acid, and iso-phthalic acid, etc. Especially preferred are benzoic acids having an o-positioned substituent, such as o-hydroxybenzoic acid, 2-nitrobenzoic acid and phthalic acid, etc.

The aromatic carboxylic acid compounds of formula (VI) can be used either as a single compound where n is a singular number or as a combination of two or more different compounds. In practical use, the composition of the present invention preferably contains, as the acid compound, SAX (trade name, produced by Mitsui Toatsu Chemical Co.) which is sold as a phenolic compound.

One or more of the above-mentioned aromatic carboxylic acid compounds of formula (V) and (VI) above can be in the composition of the present invention. The composition of the present invention containing any of these aromatic carboxylic acid compounds gives resist patterns with good profiles. In addition, the composition has good post-exposure storage stability and therefore always gives resist patterns with good profiles without depending on the period of time needed after the exposure of the composition and before the heating treatment thereof. In particular, the aromatic carboxylic acid compounds of formula (VI) are preferred, since the composition of the present invention containing any of them gives resist patterns with true rectangular profiles.

The proportion of the above-mentioned organic carboxylic acid compound to be in the composition of the present invention may be from 0.01 to 1% by weight, preferably from 0.05 to 0.5% by weight, more preferably from 0.07 to 0.3% by weight, relative to the sum of the resin component and the acid-generating agent to be in the composition. If the proportion of the organic carboxylic acid compound is less than 0.01% by weight, the composition cannot give resist patterns with good profiles. If, however, it is more than 1% by weight, the loss of the resulting film in the unexposed regions is increased. Therefore, the proportion of the acid compound not falling within the defined range is unfavorable. In the resist composition of the present invention, the detail of the function of the organic carboxylic acid compound is not clear at present. However, it is assumed that the organic carboxylic acid compound keeps the delicate balance to the acid to be generated by exposure to radiations in the resist composition.

The positive resist composition of the present invention preferably contains, in addition to the above-mentioned components, a light-absorbing agent so as to have a higher sensitivity and a higher resolution. As examples of the light-absorbing agent, mentioned are mercaptoxazole, mercaptobenzoxazole, merocaptoxazoline, mercaptobenzothiazole, benzoxazolinone, benzothiazolone, mercaptobenzoimidazole, urazole, thiouracil, mercaptopyrimidine, benzophenone and their derivatives. In particular, benzophenone is preferred, since its ability to improve the sensitivity and the resolution of the composition containing it is excellent and since it additionally has the ability to inhibit the influence of standing waves on the resist composition thereby making the composition not into resist patterns with waved profiles but into resist patterns with true rectangular profiles. The proportion of the light-absorbing agent to be in the composition of the present invention may be not more than 30% by weight, preferably from 0.5 to 15% by weight, relative to the sum of the components (A) and (B). If the proportion of the agent is more than 30% by weight, the profiles of the resist patterns to be given by the composition containing it are unfavorably worsened.

It is desirable that the positive resist composition of the present invention is used as a solution comprising the above-mentioned components dissolved in a solvent. As examples of the solvent, mentioned are ketones such as acetone, methyl ethyl ketone, cyclohexanone, methyl isoamyl ketone and 2-heptanone; polyhydric alcohols or derivatives thereof such as ethylene glycol, ethylene glycol monoacetate, diethylene glycol, diethylene glycol monoacetate, propylene glycol, propylene glycol monoacetate, dipropylene glycol, and dipropylene glycol monoacetate as well as ethers thereof, for example monomethyl ethers, monoethyl ethers, monopropyl ethers, monobutyl ethers and monophenyl ethers; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxy propionate, etc. These solvents can be used singly or as a mixture of two or more of them.

The positive resist composition of the present invention may contain, if desired, conventional miscible additives, such as additional resins to improve the properties of the resist films, as well as a plasticizer, a stabilizer, a colorant, a surfactant, etc.

The positive resist composition of the present invention is dissolved in a solvent, and the resulting solution is coated on a substrate coated with an insulating film such as silicon nitride (SIN), BPSG or the like film or on a substrate coated with a metallic film such as titanium nitride (TIN), Al-Si-Cu, tungsten or the like film, using a spinner like the like, dried to form a photosensitive layer on said substrate, exposed to deep-UV rays, excimer laser beams via a desired mask pattern or subjected to imaging with electron beams, using a minifying projection exposure machine or the like, and developed with a developer such as a weakly-alkaline aqueous solution containing from 1 to 10% by weight of tetramethylammonium hydroxide or the like. After this process, a good resist pattern faithful to the mask pattern used is formed on the substrate, not depending on the kind of the substrate used.

Next, the present invention is described in more detail by means of the following production examples and working examples, which, however, are not intended to restrict the scope of the present invention.

PRODUCTION EXAMPLE 1

(Production of polyhydroxystyrene where 8 mol % of the hydroxyl groups have been substituted by tert-butoxycarbonyloxy groups).

120 g of polyhydroxystyrene having a weight-average molecular weight of 20,000 and a molecular weight distribution ($M_w/M_n$) of 4.0 were dissolved in 680 g of N,N-dimethyl acetamide, and 17.4 g of di-tert-butyl dicarbonate were added to the resulting solution and stirred to completely dissolve them. Next, 59 g of triethylamine were dropwise added thereto over a period of about 15 minutes with still stirring. After the addition, this mixture was further stirred for about 3 hours. Next, to the resulting solution added was pure water of 20 times the solution. This was further stirred to make polyhydroxystyrene where the hydroxyl groups had been partly substituted by tert-butoxycarbonyloxy groups precipitated therein. The thus-precipitated product was washed with pure water, dewatered and dried to obtain 125 g of polyhydroxystyrene where 8 mol % of the hydroxyl groups had been substituted by tert-butoxycarbonyloxy groups.

PRODUCTION EXAMPLE 2

(Production of polyhydroxystyrene where 35 mol % of the hydroxyl groups have been substituted by tert-butoxycarbonyloxy groups).

145 g of polyhydroxystyrene where 35 mol % of the hydroxyl groups had been substituted by tert-butoxy carbonyloxy groups were obtained as in the same manner in Production Example 1, except that the added weight of di-tert-butyl dicarbonate was changed to 76.5 g.

PRODUCTION EXAMPLE 3

(Production of polyhydroxystyrene where 39 mol % of the hydroxyl groups have been substituted by tert-butoxycarbonyloxy groups).

150 g of polyhydroxystyrene where 39 mol % of the hydroxyl groups had been substituted by tert-butoxycarbonyloxy groups were obtained as in the same manner in Production Example 1, except that the added weight of di-tert-butyldicarbonate was changed to 85.0 g.

PRODUCTION EXAMPLE 4

(Production of polyhydroxystyrene where 70 mol % of the hydroxyl groups have been substituted by tert-butoxycarbonyloxy groups).

180 g of polyhydroxystyrene where 70 mol % of the hydroxyl groups had been substituted by tert-butoxycarbonyloxy groups were obtained as in the same manner in Production Example 1, except that the added weight of di-tert-butyl dicarbonate was changed to 153 g.

PRODUCTION EXAMPLE 5

(Production of polyhydroxystyrene where 35 mol % of the hydroxyl groups have been substituted by ethoxyethoxy groups).

120 g of polyhydroxystyrene having a weight-average molecular weight of 20,000 and a molecular weight distribution ($M_w/M_n$) of 4.0 were dissolved in 680 g of N,N-dimethylacetamide, and 37.2 g of 1-chloro-1-ethoxyethane were added to the resulting solution and stirred to completely dissolve them. Next, 78.8 g of triethylamine were dropwise added thereto over a period of about 30 minutes with still stirring. After the addition, this mixture was further stirred for about 3 hours. Next, to the resulting solution added was pure water of 20 times the solution. This was further stirred. Thus, 130 g of polyhydroxystyrene where 35 mol % of the hydroxyl groups had been partly substituted by 1-ethoxyethoxy groups were obtained.

PRODUCTION EXAMPLE 6

(Production of polyhydroxystyrene where 8 mol % of the hydroxyl groups have been substituted by methoxy-n-propyloxy groups).

120 g of polyhydroxystyrene having a weight-average molecular weight of 20,000 and a molecular weight distribution ($M_w/M_n$) of 4.0 were dissolved in 680 g of N,N-dimethylacetamide, and 8.6 g of 1-chloro-1-methoxypropane were added to the resulting solution and stirred to completely dissolve them. Next, 78.8 g of triethylamine were dropwise added thereto over a period of about 30 minutes with still stirring. After the addition, this mixture was further stirred for about 3 hours. Next, to the resulting solution added was pure water of 20 times the solution. This was further stirred to make polyhydroxystyrene where the hydroxyl groups had been partly substituted by 1-methoxy-n-propyloxy groups precipitated therein. The thus-precipitated product was washed, dewatered and dried to obtain 125 g of polyhydroxystyrene where 8 mol % of the hydroxyl groups had been substituted by 1-methoxy-n-propyloxy groups.

PRODUCTION EXAMPLE 7

(Production of polyhydroxystyrene where 39 mol % of the hydroxyl groups have been substituted by methoxy-n-propyloxy groups).

130 g of polyhydroxystyrene where 39 mol % of the hydroxyl groups had been substituted by 1-methoxy-n-propyloxy groups were obtained in the same manner as in Production Example 6, except that the added weight of 1-chloro-1-methoxypropane was changed to 42.3 g.

PRODUCTION EXAMPLE 8

(Production of polyhydroxystyrene where 70 mol % of the hydroxyl groups have been substituted by methoxy-n-propyloxy groups).

150 g of polyhydroxystyrene where 70 mol % of the hydroxyl groups had been substituted by 1-methoxy-n-propyloxy groups were obtained in the same manner as in Production Example 6, except that the added weight of 1-chloro-1-methoxy propane was changed to 75.6 g.

EXAMPLE 1

1.48 g of polyhydroxystyrene obtained in Production Example 2, in which 35 mol % of the hydroxyl groups had been substituted by tert-butoxycarbonyloxy groups, and 1.48 g of polyhydroxystyrene obtained in Production Example 5, in which 35 mol % of the hydroxyl groups had been substituted by ethoxyethoxy groups, were dissolved in 16.8 g of propylene glycol monomethyl ether acetate, and 0.148 g of bis(cyclohexyl-sulfonyl)diazomethane and 0.093 g of benzophenone were added thereto and dissolved. The resulting solution was filtered through a 0.2 µm membrane filter to obtain a coating liquid of positive resist.

The thus-prepared coating liquid was coated on a 6 inches silicon wafer, using a spinner, and dried on a hot plate at 90° C. for 90 seconds to form a resist film having a thickness of 0.7 µm on the wafer. This was exposed via a test chart mask, using a minifying projection exposure machine, NSR-2005EX8A (produced by Nicon Co.), heated at 120° C. for 90 seconds, then developed by puddling it in an aqueous solution of 2.38% by weight of tetramethylammonium hydroxide for 65 seconds, washed with water for 30 seconds, and dried to form a resist pattern on the wafer. The resist pattern thus formed was a 0.21 µm line-and-space pattern. The cross-sectional profile of the resist pattern was good and almost rectangular, though somewhat trapezoidal. The resist pattern was not influenced by standing waves. The minimum exposure amount, at which the resist coated was patterned into a large-area resist pattern detectable with the naked eye while the surface of the substrate was exposed to be seen, (this is hereinafter simply referred to as "minimum exposure amount") was measured to be 7 mJ/cm$^2$. The heat resistance of the 0.5 µm line pattern formed from the resist was measured to be at 130° C. (The heat resistance as referred to herein means the temperature at which the pattern formed begins to flow under heat.) Apart from this, the resist film coated on the wafer was exposed, then left as it was for 15 minutes and then heated at 120° C. for 90 seconds. This was processed in the same manner as above. However, the crosssectional profile of the resist pattern thus formed was T-shaped, and the finest patterning limit of the resist was to give a 0.3 µm line-and-space pattern.

EXAMPLE 2

A resist pattern was formed in the same manner as in Example 1, except that benzophenone was not added to the coating liquid of positive resist. The resist pattern thus formed was a 0.21 µm line-and-space pattern. The cross-sectional profile of the resist pattern was good and almost rectangular, though somewhat waved but in a negligible degree for practical use. The minimum exposure amount for the resist was measured to be 6 mJ/cm$^2$. The heat resistance of the 0.5 µm line pattern formed from the resist was measured to be at 130° C.

COMPARATIVE EXAMPLE 1

2.96 g of polyhydroxystyrene obtained in Production Example 2, in which 35 mol % of the hydroxyl groups had been substituted by tert-butoxycarbonyloxy groups, were dissolved in 16.8 g of propylene glycol monomethyl ether acetate, and 0.148 g of bis(cyclohexylsulfonyl) diazomethane and 0.093 g of benzophenone were added thereto and dissolved. The resulting solution was filtered through a 0.2 µm membrane filter to obtain a coating liquid of positive resist.

Using the thus-prepared coating liquid, a resist pattern was formed in the same manner as in Example 1. However, the finest patterning limit of the resist was to give a 0.28 µm line-and-space pattern. The crosssectional profile of the pattern thus formed was not good, as being expanded downward to the substrate. The minimum exposure amount for the resist was measured to be 35 mJ/cm$^2$. The heat resistance of the 0.5 µm line pattern formed from the resist was measured to be at 150° C.

COMPARATIVE EXAMPLE 2

2.96 g of polyhydroxystyrene obtained in Production Example 5, in which 35 mol % of the hydroxyl groups had been substituted by ethoxyethoxy groups, were dissolved in 16.8 g of propylene glycol monomethyl ether acetate, and 0.148 g of bis(cyclohexylsulfonyl)diazomethane and 0.093 g of benzophenone were added thereto and dissolved. The resulting solution was filtered through a 0.2 µm membrane filter to obtain a coating liquid of positive resist.

Using the thus-prepared coating liquid, a resist pattern was formed in the same manner as in Example 1. However, the finest patterning limit of the resist was to give a 0.25 µm line-and-space pattern. The crosssectional profile of the pattern thus formed was not good, having an inverted triangular shape. The minimum exposure amount for the resist was measured to be 7 mJ/cm$^2$. The heat resistance of the 0.5 µm line pattern formed from the resist was measured to be at 120° C.

EXAMPLE 3

1.48 g of polyhydroxystyrene (having a weight-average molecular weight of 20,000 and a morecular weight distribution ($M_w/M_n$) of 4.0) obtained in Production Example 2, in which 35 mol % of the hydroxyl groups had been substituted by tert-butoxycarbonyloxy groups, and 1.48 g of polyhydroxystyrene (having a weight-average molecular weight of 20,000 and a morecular weight distribution ($M_w/M_n$) of 4.0) obtained in Production Example 5, in which 35 mol % of the hydroxyl groups had been substituted by ethoxyethoxy groups, were dissolved in 16.8 g of propylene glycol monomethyl ether acetate, and 0.148 g of bis (cyclohexylsulfonyl)diazomethane, 0.093 g of benzophenone and 0.0032 g of o-hydroxybenzoic acid were added thereto and dissolved. The resulting solution was filtered through a 0.2 µm membrane filter to obtain a coating liquid of positive resist.

The thus-prepared coating liquid was coated on a 6 inches silicon wafer, using a spinner, and dried on a hot plate at 90° C. for 90 seconds to form a resist film having a thickness of 0.7 µm on the wafer. This was exposed to excimer laser via a test chart mask, using a minifying projection exposure machine, NSR-2005EXSA (produced by Nicon Co.), heated at 120° C. for 90 seconds, then developed by puddling it in an aqueous solution of 2.38% by weight of tetramethylammonium hydroxide for 65 seconds, washed with water for 30 seconds, and dried to form a resist pattern on the wafer. The resist pattern thus formed was a 0.21 μm line-and-space pattern. The crosssectional profile of the resist pattern was good and almost rectangular, though somewhat roundish at the top. The resist pattern was not influenced by standing waves. The minimum exposure amount was measured to be 7 mJ/cm$^2$. The heat resistance of the 0.5 μm line pattern formed from the resist was measured to be at 130° C. The width of focus depth was evaluated based on a criteria that the maximum width (μm) of a focus by which a 0.25 μm line-and-space pattern was formed by 1:1 was 1.0 μm or more as "A" rank and the maximum width was less than 1.0 μm m as "B" rank. As a result, the width of focus depth was determined to be "A". When the resist solution was stored in a brown bottle at 25° C. for evaluation of storage stability, no generation of solid substances had been observed for six months.

Using this resist, a resist pattern was formed in the same manner as above, except that the resist was, after exposed, left as it was for 15 minutes and then heated at 120 for 90 seconds. The resist pattern thus formed was a 0.21 μm line-and-space pattern having a good, rectangular cross-sectional profile.

EXAMPLE 4

A resist pattern was formed in the same manner as in Example 3, except that benzophenone was not added to the coating liquid of positive resist composition. The resist pattern thus formed was a 0.23 μm line-and-space pattern. The crosssectional profile of the resist pattern was good and almost rectangular, though somewhat roundish at the top and waved but in a negligible degree for practical use. The minimum exposure amount for the resist was measured to be 8 mJ/cm$^2$. The heat resistance of the 0.5 μm line pattern formed from the resist was measured to be at 130° C. The width of focus depth was evaluated in the same manner as in Example 3 to be "A" rank. In addition, when the storage stability of the resist solution was evaluated in the same manner as in Example 3, no generation of solid substances had been observed for six months.

Using this resist, a resist pattern was formed in the same manner as in Example 3, except that the resist was, after exposed, left as it was for 15 minutes and then heated at 120° C. for 90 seconds. The resist pattern thus formed was a 0.23 μm line-and-space pattern having a good crosssectional profile.

EXAMPLE 5

A resist pattern was formed in the same manner as in Example 3, except that 0.0062 g of SAX (trade name, produced by Mitsui Toatsu Chemical Co.), which is sold as a phenolic compound, were used in place of o-hydroxybenzoic acid. The resist pattern thus formed was a 0.21 μm line-and-space pattern. The crosssectional profile of the resist pattern was good and rectangular, without being influenced by standing waves. The minimum exposure amount for the resist was measured to be 7 mJ/cm$^2$. The heat resistance of the 0.5 μm line pattern formed from the resist was measured to be at 130° C. The width of focus depth was evaluated in the same manner as in Example 3 to be "A" rank. In addition, when the storage stability of the resist solution was evaluated in the same manner as in Example 3, no generation of solid substances had been observed for six months.

Using this resist, a resist pattern was formed in the same manner as in Example 3, except that the resist was, after exposed, left as it was for 15 minutes and then heated at 120° C. for 90 seconds. The resist pattern thus formed was a 0.21 μm line-and-space pattern having a good, rectangular cross-sectional profile.

EXAMPLE 6

A resist pattern was formed in the same manner as in Example 3, except that 0.0062 g of acrylic acid were used in place of o-hydroxybenzoic acid. The resist pattern thus formed was a 0.21 μm line-and-space pattern. The crosssectional profile of the resist pattern was good and rectangular, without being influenced by standing waves. The minimum exposure amount for the resist was measured to be 7 mJ/cm$^2$. The heat resistance of the 0.5 μm line pattern formed from the resist was measured to be at 130° C. The width of focus depth was evaluated in the same manner as in Example 3 to be "A" rank. In addition, when the storage stability of the resist solution was evaluated in the same manner as in Example 3, no generation of solid substances had been observed for six months.

Using this resist, a resist pattern was formed in the same manner as in Example 3, except that the resist was, after exposed, left as it was for 15 minutes and then heated at 120° C. for 90 seconds. The resist pattern thus formed was a 0.21 μm line-and-space pattern having a good, rectangular cross-sectional profile.

EXAMPLE 7

1.05 g of polyhydroxystyrene obtained in Production Example 3, in which 39 mol % of the hydroxyl groups had been substituted by tert-butoxycarbonyloxy groups, and 1.95 g of polyhydroxystyrene obtained in Production Example 7, in which 39 mol % of the hydroxyl groups had been substituted by 1-methoxy-n-propyloxy groups, were dissolved in 16.8 g of propylene glycol monomethyl ether acetate, and 0.21 g of bis(cyclohexylsulfonyl)diazomethane and 0.009 g of o-nitro-benzoic acid were added thereto and dissolved. The resulting solution was filtered through a 0.2 μm membrane filter to obtain a coating liquid of positive resist.

The thus-prepared coating liquid was coated on a 6 inches silicon wafer, using a spinner, and dried on a hot plate at 90° C. for 90 seconds to form a resist film having a thickness of 0.7 μm on the wafer. This was exposed via a test chart mask, using a minifying projection exposure machine, NSR-2005EX8A (produced by Nicon Co.), heated at 110° C. for 90 seconds, then developed by puddling it in an aqueous solution of 2.38% by weight of tetramethylammonium hydroxide for 65 seconds, washed with water for 30 seconds, and dried to form a resist pattern on the wafer. The resist pattern thus formed was a 0.22 μm line-and-space pattern. The crosssectional profile of the resist pattern was good and rectangular, though somewhat waved but in a negligible degree for practical use. The minimum exposure amount was measured to be 15 mJ/cm$^2$. The heat resistance of the 0.5 μm line pattern formed from the resist was measured to be at 130° C. The width of focus depth was evaluated in the same manner as in Example 3 to be "A" rank. In addition, when the storage stability of the resist solution was evaluated in the same manner as in Example 3, no generation of solid substances had been observed for six months.

EXAMPLE 8

A coating liquid of resist was formed in the same manner as in Example 7, except that SAX (trade name, produced by Mitsui Toatsu Chemical Co.) was used in place of o-nitrobenzoic acid and that 0.128 g of benzophenone were added to the liquid. The properties of the thus-formed resist were evaluated in the same manner as in Example 7. This resist gave a 0.22 µm line-and-space pattern. The crosssectional profile of the resist pattern thus formed was good and rectangular, without being influenced by standing waves. The minimum exposure amount for the resist was measured to be 13 mJ/cm$^2$. The heat resistance of the 0.5 µm line pattern formed from the resist was measured to be at 130° C. The width of focus depth was evaluated in the same manner as in Example 3 to be "A" rank. In addition, when the storage stability of the resist solution was evaluated in the same manner as in Example 3, no generation of solid substances had been observed for six months.

EXAMPLE 9

A coating liquid of resist was formed in the same manner as in Example 7, except that 0.003 g of o-hydroxy benzoic acid were used in place of o-nitrobenzoic acid and 0.128 g of benzophenone were then added.

The properties of the thus-formed resist were evaluated in the same manner as in Example 7. This resist gave a 0.22 µm line-and-space pattern. The crosssectional profile of the resist pattern thus formed was good and rectangular, although somewhat roundish at the top. The resist pattern was not influenced by standing waves. The minimum exposure amount for the resist was measured to be 7 mJ/cm$^2$. The heat resistance of the 0.5 µm line pattern formed from the resist was measured to be at 130° C. The width of focus depth was evaluated in the same manner as in Example 3 to be "A" rank. In addition, when the storage stability of the resist solution was evaluated in the same manner as in Example 3, no generation of solid substances had been observed for six months.

EXAMPLE 10

A coating liquid of positive resist was formed in the same manner as in Example 7, except that 0.009 g of 1,1-cyclohexanedicarboxylic acid were added to the liquid in place of o-nitrobenzoic acid.

The properties of the thus-formed resist were evaluated in the same manner as in Example 7. This resist gave a 0.21 µm line-and-space pattern. The crosssectional profile of the resist pattern thus formed was good and rectangular, though somewhat waved but in a negligible degree for practical use. The minimum exposure amount for the resist was 13 mJ/cm$^2$. The heat resistance of the 0.5 µm line pattern formed from the resist was measured to be at 130° C. The width of focus depth was evaluated in the same manner as in Example 3 to be "A" rank. In addition, when the storage stability of the resist solution was evaluated in the same manner as in Example 3, no generation of solid substances had been observed for six months.

Using this resist, a resist pattern was formed as above, except that the resist was, after exposed, left as it was for 30 minutes and then heated at 110° C. for 90 seconds. The resist pattern thus formed was a 0.21 µm line-and-space pattern having a good, rectangular crosssectional profile.

EXAMPLE 11

A coating liquid of positive resis was formed in the same manner as in Example 10, except that 0.12 g of benzophenone were then added to the liquid. The properties of the thus-formed resist were evaluated in the same manner as in Example 10. This resist gave a 0.21 µm line-and-space pattern. The crosssectional profile of the resist pattern was good and rectangular without being influenced by standing waves. The minimum exposure amount for the resist was measured to be 13 mJ/cm$^2$. The heat resistance of the 0.5 µm line pattern formed from the resist was measured to be at 130° C. The width of focus depth was evaluated in the same manner as in Example 3 to be "A" rank. In addition, when the storage stability of the resist solution was evaluated in the same manner as in Example 3, no generation of solid substances had been observed for six months.

The resist was, after exposed, left as it was for 30 minutes and then heated at 110° C. for 90 seconds. The resist pattern thus formed was a 0.21 µm line-and-space pattern having a good, rectangular crosssectional profile.

COMPARATIVE EXAMPLE 3

1.05 g of polyhydroxystyrene obtained in Production Example 1, in which 8% of the hydroxyl groups had been substituted by tert-butoxycarbonyloxy groups, and 1.95 g of polyhydroxystyrene obtained in Production Example 6, in which 8% of the hydroxyl groups had been substituted by methoxy-n-propyloxy groups, were dissolved in 16.8 g of propylene glycol monomethyl ether acetate, and 0.21 g of bis(cyclohexyl-sulfonyl)diazomethane, 0.009 g of o-nitrobenzoic acid and 0.128 g of benzophenone were added thereto and dissolved. The resulting solution was filtered through a 0.2 µm membrane filter to obtain a coating liquid of positive resist.

The thus-prepared coating liquid was tried in the same manner as in Example 7 so as to evaluate the characteristics of the resist but in vain, since this did not give a resist pattern.

COMPARATIVE EXAMPLE 4

1.05 g of polyhydroxystyrene in Production Example 4, in which 70% of the hydroxyl groups had been substituted by tert-butoxycarbonyloxy groups, and 1.95 g of polyhydroxystyrene in Production Example 8, in which 70% of the hydroxyl groups had been substituted by 1-methoxy-n-propyloxy groups, were dissolved in 16.8 g of propylene glycol monomethyl ether acetate, and 0.21 g of bis(cyclohexylsulfonyl)diazomethane, 0.009 g of SAX (trade name, produced by Mitsui Toatsu Chemical Co.) and 0.128 g of benzophenone were added thereto and dissolved. The resulting solution was filtered through a 0.2 µm membrane filter to obtain a coating liquid of positive resist.

The properties of the thus-formed resist were evaluated in the same manner as in Example 7. The finest patterning limit of the resist was to give a 0.3 µm line-and-space pattern. The crosssectional profile of the pattern given by the resist was not good and T-shaped. The minimum exposure amount for the resist was 20 mJ/cm$^2$. The heat resistance of the 0.5 µm line pattern formed from the resist was measured to be at 130° C.

COMPARATIVE EXAMPLE 5

1.05 g of polyhydroxystyrene in Production Example 1, in which 8% of the hydroxyl groups had been substituted by tert-butoxycarbonyloxy groups, and 1.95 g of polyhydroxystyrene in Production Example 8, in which 70% of the hydroxyl groups had been substituted by 1-methoxy-n-propyloxy groups were dissolved in 16.8 g of propylene glycol monomethylether acetate, and 0.21 g of bis(cyclohexylsulfonyl) diazomethane, 0.009 g of phthalic acid and 0.128 g of benzophenone were added thereto and dissolved. The resulting solution was filtered through a 0.2 µm membrane filter to obtain a coating liquid of positive resist.

The properties of the thus-formed resist were evaluated in the same manner as in Example 7. The finest patterning limit of the resist was to give a 0.3 µm line-and-space pattern. The crosssectional profile of the pattern given by the resist was not good, nearly having an inverted triangular shape. The minimum exposure amount for the resist was 10 mJ /cm$^2$. The heat resistance of the 0.5 µm line pattern formed from the resist was measured to be at 130° C.

COMPARATIVE EXAMPLE 6

2.96 g of polyhydroxystyrene obtained in Production Example 2, in which 35 mol % of the hydroxyl groups had been substituted by tert-butoxycarbonyloxy groups, was dissolved in 16.8 g of propylene glycol monomethyl ether acetate, and 0.09 g of triphenylsulfonium hexafluoroantimonate was added thereto and dissolved. The resulting solution was filtered through a 0.2 µm membrane filter to obtain a coating liquid of positive resist.

Using the thus-prepared coating solution, a resist pattern was formed in the same manner as in Example 1. However, the finest patterning limit of the resist was to give 0.30 µm line-and-space pattern. The crosssectional profile of the pattern thus formed was not good, being broadend upward. The minimum exposure amount for the resist was measured to be 10 mJ/cm$^2$. The heat resistance of the 0.5 µm line pattern formed from the resist was measured to be at 140° C. The width of focus depth was evaluted in the same manner as in Example 1 to be "B" rank.

The resist was, after exposed, left as it was for 15 minutes and then heated at 120° C. for 90 seconds. The finest patterning limit of the resist was to give 0.5 µm line-and-space pattern. The crosssectional profile of the pattern thus formed was T-top shape.

EXAMPLE 12

A resist pattern was formed in the same manner as in Example 3, except that a silicon wafer coated with an insulating film of silicon nitride (SIN) was used as the substrate.

The resist pattern thus formed was a 0.23 µm line-and-space pattern. The crosssectional profile of the resist pattern was good and almost rectangular, without being influenced by standing waves.

EXAMPLE 13

A resist pattern was formed in the same manner as in Example 3, except that a silicon wafer coated with a metallic film of TiN was used as the substrate. The resist pattern thus formed was a 0.23 µm line-and-space pattern. The crosssectional profile of the resist pattern was good and almost rectangular, without being influenced by standing waves.

EXAMPLE 14

A resist pattern was formed in the same manner as in Example 3, except that a silicon wafer coated with an insulating film of BPSG was used as the substrate. The resist pattern thus formed was a 0.23 µm line-and-space pattern. The crosssectional profile of the resist pattern was good and almost rectangular, without being influenced by standing waves.

COMPARATIVE EXAMPLE 7

A resist pattern was formed in the same manner as in Comparative Example 6, except that a silicon wafer coated with a metallic film of SiN was used as the substrate. The resist pattern thus formed was a 0.30 µm line-and-space pattern. The crosssectional profile of the resist pattern was expanded downward to the boundary between the pattern and the substrate.

COMPARATIVE EXAMPLE 8

A resist pattern was formed in the same manner as in Example 1, except that a silicon wafer coated with a insulating film of SiN was used as the substrate. The crosssectional profile of the resist pattern was expanded downward.

EXAMPLE 15

0.9 g of polyhydroxystyrene obtained in Production Example 3, in which 39 mol % of the hydroxyl groups had been substituted by tert-butoxycarbonyloxy groups, and 2.1 g of polyhydroxystyrene obtained in Production Example 5, in which 35 mol % of the hydroxyl groups had been substituted by ethoxyethoxy groups, were dissolved in 16.8 g of propylene glycol monomethyl ether acetate, and 0.15 g of pyrogallol trimesylate and 6.3 mg of salicylic acid were added thereto and dissolved. The resulting solution was filtered through a 0.2 µm membrane filter to obtain a coating liquid of positive resist.

The thus-prepared coating liquid was coated on a 6 inches silicon wafer, using a spinner, and dried on a hot plate at 90° C. for 90 seconds to form a resist film having a thickness of 0.7 µm on the wafer. This was subjected to imaging, using an electron beam radiator, HL-8000 (produced by Hitachi, Ltd.), heated at 110° C. for 90 seconds, then developed by puddling it in an aqueous solution of 2.38% by weight of tetramethylammonium hydroxide for 65 seconds, washed with water for 30 seconds, and dried to form a resist pattern on the wafer. In this way, 0.12 µm contact holes were formed. The crosssectional profile of the resist pattern thus formed was good and rectangular. The exposure amount for this patterning was measured to be 25 µC/cm$^2$.

EXAMPLE 16

A coating liquid of positive resist was prepared in the same manner as in Example 15, except that 0.15 g of bis(p-tert-butylphenyl)iodonium trifluoromethanesulfonate were used as the acid-generating agent in place of pyrogallol trimesylate.

Using this, a resist pattern was formed in the same manner as in Example 15. 0.15 µm contact holes were formed. The crosssectional profile of the resist pattern formed was good and rectangular. The exposure amount for this patterning was 10 µC/cm$^2$.

EXAMPLE 17

A coating liquid of positive resist was prepared in the same manner as in Example 15, except that 0.15 g of 2,6-dinitrobenzyl p-toluenesulfonate were used as the acid-generating agent in place of pyrogallol trimesylate.

Using this, a resist pattern was formed in the same manner as in Example 15. 0.14 µm contact holes were formed. The crosssectional profile of the resist pattern formed was good and rectangular. The exposure amount for this patterning was 35 µC/cm$^2$.

EXAMPLE 18

A coating liquid of positive resist was prepared in the same manner as in Example 15, except that 0. 15 g of tri-phenylsulfonium trifluoromethanesulfonate were used as the acid-generating agent in place of pyrogallol trimesylate.

Using this, a resist pattern was formed in the same manner as in Example 15. 0.15 μm contact holes were formed. The crosssectional profile of the resist pattern formed was good and rectangular. The exposure amount for this patterning was 10 μC/cm².

EXAMPLE 19

0.9 g of polyhydroxystyrene obtained in Production Example 3, in which 39 mol % of the hydroxyl groups had been substituted by tert-butoxycarbonyloxy groups, and 2.1 g of polyhydroxystyrene obtained in Production Example 7, in which 39 mol % of the hydroxyl groups had been substituted by 1-methoxy-n-propyloxy groups were dissolved in 16.8 g of propylene glycol monomethylether acetate, and 0.03 g of bis(cyclohexylsulfonyl)diazomethane, and 0.15 g of bis(2,4-dimethylphenylsulfonyl)diazomethane and 0.0064 g of o-hydroxybenzoic acid were added thereto and dissolved. The resulting solution was filtered through a 0.2 μm membrane filter to obtain a coating liquid of positive resist.

The properties of the thus-formed resist were evaluated in the same manner as in Example 9. This resist gave a 0.2 μm line-and-space pattern. The crosssectional profile of the resist pattern thus formed was good and rectangular though somewhat waved but in a negligible degree for practical use; The minimum exposure amount for the resist was measured to be 5 mJ/cm². The heat resistance of the 0.5 μm line-space pattern formed from the resist was measured to be at 130° C. The width of focus depth was evaluated in the same manner as in Example 3 to be "A" rank. In addition, when the storage stability of the resist solution was evaluated in the same manner as in Example 3, no generation of solid substances had been observed for six months.

What is claimed is:

1. A positive resist composition comprising a mixture of (A) a resin component whose solubility in an alkaline aqueous solution is increased by the action of acids, and (B) a compound which generates an acid when exposed to radiations, in which said resin component (A) is a mixture comprising from 30 to 90% by weight of (a) a polyhydroxystyrene where from 10 to 60 mol % of the hydroxyl groups have been substituted by residues of a general formula (I):

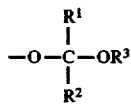

wherein R¹ represents a hydrogen atom or a methyl group, R² represents a methyl group or an ethyl group, and R³ represents a lower alkyl group having 1 to 4 carbon atoms;

and from 10 to 70% by weight of (b) a polyhydroxystyrene where from 10 to 60 mol % of the hydroxyl groups have been substituted by tert-butoxycarbonyloxy groups.

2. The positive resist composition as claimed in claim 1, in which said resin component (A) is a mixture comprising (a) a polyhydroxystyrene having a weight-average molecular weight of from 8,000 to 22,000, where from 10 to 60 mol % of the hydroxyl groups have been substituted by residues of a general formula (I):

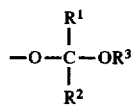

wherein R¹ represents a hydrogen atom or a methyl group, R² represents a methyl group or an ethyl group, and R³ represents a lower alkyl group having 1 to 4 carbon atoms; and (b) a polyhydroxystyrene having a weight-average molecular weight of from 8,000 to 22,000, where from 10 to 60 mol % of the hydroxyl groups have been substituted by tert-butoxycarbonyloxy groups.

3. The positive resist composition as claimed in claim 1, in which said resin component (A) is a mixture comprising (a) a polyhydroxystyrene having a weight-average molecular weight of from 8,000 to 22,000 and a molecular weight distribution ($M_w/M_n$) of from 3 to 5, where from 10 to 60 mol % of the hydroxyl groups have been substituted by residues of a general formula (I):

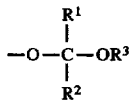

wherein R¹ represents a hydrogen atom or a methyl group, R² represents a methyl group or an ethyl group, and R³ represents a lower alkyl group having 1 to 4 carbon atoms;

and (b) a polyhydroxystyrene having a weight-average molecular weight of from 8,000 to 22,000 and a molecular weight distribution ($M_w/M_n$) of from 3 to 5, where from 10 to 60 mol % of the hydroxyl groups have been substituted by tert-butoxycarbonyloxy groups.

4. The positive resist composition as claimed in claim 1, in which said component (A) is a mixture comprising from 50 to 80% by weight of the component (a) and from 20 to 50% by weight of the component (b).

5. The positive resist composition as claimed in claim 1, in which the component (B) is a bissulfonyldiazomethanes-based acid-generating agent.

6. The positive resist composition as claimed in claim 1, in which the component(B) is at least one member selected from the group consisting of nitrobenzyl-based acid-generating agents, aliphatic and aromatic sulfonic acid esters of polyhydroxy compounds-based acid-generating agents, onium salts-based acid-generating agents, and benzoin tosylates-based acid-generating agents.

7. The positive resist composition as claimed in claim 1, in which the proportion of the component (B) is from 1 to 20 parts by weight relative to 100 parts by weight of the component (A).

8. The positive resist composition as claimed in claim 1, which additionally contains a light-absorbing agent.

9. The positive resist composition as claimed in claim 8, in which the light-absorbing agent is benzophenone.

10. A positive resist composition comprising a mixture of (A) a resin component whose solubility in an alkaline aqueous solution is increased by the action of acids, (B) a compound which generates an acid when exposed to radiations, and (C) an organic carboxylic acid compound, in which said resin component (A) is a mixture comprising from 30 to 90% by weight of (a) a polyhydroxystyrene where from 10 to 60 mol % of the hydroxyl groups have been substituted by residues of a general formula (I):

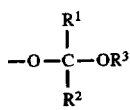

wherein R¹ represents a hydrogen atom or a methyl group, R² represents a methyl group or an ethyl group, and R³ represents a lower alkyl group having 1 to 4 carbon atoms;

and from 10 to 70% by weight (b) a polyhydroxystyrene where from 10 to 60 mol % of the hydroxyl groups have been substituted by tert-butoxycarbonyloxy groups.

11. The positive resist composition as claimed in claim 10, in which said resin component (A) is a mixture comprising (a) a polyhydroxystyrene having a weight-average molecular weight of from 8,000 to 22,000, where from 10 to 60 mol % of the hydroxyl groups have been substituted by residues of a general formula (I):

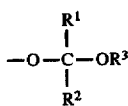

wherein R¹ represents a hydrogen atom or a methyl group, R² represents a methyl group or an ethyl group, and R³ represents a lower alkyl group having 1 to 4 carbon atoms;

and (b) a polyhydroxystyrene having a weight-average molecular weight of from 8,000 to 22,000, where from 10 to 60 mol % of the hydroxyl groups have been substituted by tert-butoxycarbonyloxy groups.

12. The positive resist composition as claimed in claim 10, in which said resin component (A) is a mixture comprising (a) a polyhydroxystyrene having a weight-average molecular weight of from 8,000 to 22,000 and a molecular weight distribution ($M_w/M_n$) of from 3 to 5, where from 10 to 60 mol % of the hydroxyl groups have been substituted by residues of a general formula (I):

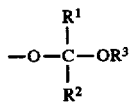

wherein R¹ represents a hydrogen atom or a methyl group, R² represents a methyl group or an ethyl group, and R³ represents a lower alkyl group having 1 to 4 carbon atoms;

and (b) a polyhydroxystyrene having a weight-average molecular weight of from 8,000 to 22,000 and a molecular weight distribution ($M_w/M_n$) of from 3 to 5, where from 10 to 60 mol % of the hydroxyl groups have been substituted by tert-butoxycarbonyloxy groups.

13. The positive resist composition as claimed in claim 10, in which said component (A) is a mixture comprising from 50 to 80% by weight of the component (a) and from 20 to 50% by weight of the component (b).

14. The positive resist composition as claimed in claim 10, in which the component (B) is a bissulfonyldiazomethanes-based acid-generating agent.

15. The positive resist composition as claimed in claim 10, in which the component (B) is at least one member selected from the group consisting of nitrobenzyl-based acid-generating agents, aliphatic and aromatic sulfonic acid esters of polyhydroxy compounds-based acid-generating agents, onium salts-based acid-generating agents, and benzoin tosylates-based acid-generating agents.

16. The positive resist composition as claimed in claim 10, in which the proportion of the component (B) is from 1 to 20 parts by weight relative to 100 parts by weight of the component (A).

17. The positive resist composition as claimed in claim 10, in which the component (C) is at least one member selected from the group consisting of aromatic carboxylic acid compounds, alicyclic carboxylic acid compounds and unsaturated aliphatic carboxylic acid compounds.

18. The positive resist composition as claimed in claim 17, in which said aromatic carboxylic acid compounds are represented by a general formula (V):

wherein R¹³ and R¹⁴ each independently represent a hydrogen atom, a hydroxyl group, a nitro group, a carboxyl group or a vinyl group, provided that both R¹³ and R¹⁴ must not be hydrogen atoms.

19. The positive resist composition as claimed in claim 17, in which said aromatic carboxylic acid compounds are represented by a general formula (VI):

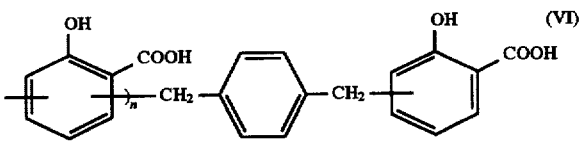

wherein n represents 0 or an integer of from 1 to 10.

20. The positive resist composition as claimed in claim 17, in which said alicyclic carboxylic acid compound is at least one member selected from the group consisting of 1,1-cyclohexanedicarboxylic acid, 1,2-cyclohexanedicarboxylic acid, 1,3-cyclohexanedicarboxylic acid, 1,4-cyclohexanedicarboxylic acid, and 1,1-cyclohexyldiacetic acid.

21. The positive resist composition as claimed in claim 17, in which an unsaturated aliphatic carboxylic acid is at least one selected from the group consisting of acrylic acid, crotonic acid, isocrotonic acid, 3-butenoic acid, methacrylic acid, 4-pentenoic acid, propiolic acid, 2-butynoic acid, maleic acid, fumaric acid, and acetylenecarboxylic acid.

22. The positive resist composition as claimed in claim 10, in which the proportion of the component (C) is from 0.01 to 1% by weight relative to the sum of the components (A) and (B).

23. The positive resist composition as claimed in claim 10, which additionally contains a light-absorbing agent.

24. The positive resist composition as claimed in claim 23, in which a light-absorbing agent is benzophenone.

* * * * *